United States Patent [19]

Davidson

[11] Patent Number: 5,364,004
[45] Date of Patent: Nov. 15, 1994

[54] WEDGE BUMP BONDING APPARATUS AND METHOD

[75] Inventor: R. Paul Davidson, Plymouth, Minn.

[73] Assignee: Hughes Aircraft Company, Los Angeles, Calif.

[21] Appl. No.: 60,085

[22] Filed: May 10, 1993

[51] Int. Cl.$^5$ ............................................. H01L 21/607
[52] U.S. Cl. ......................................... 228/1.1; 228/4.5
[58] Field of Search ............... 228/1.1, 4.5, 179, 110.1, 228/180.5

[56] References Cited

U.S. PATENT DOCUMENTS

| | | | |
|---|---|---|---|
| 4,418,858 | 12/1983 | Miller | 228/180.5 X |
| 4,718,591 | 1/1988 | Hill | 228/1.1 |
| 5,058,798 | 10/1991 | Yamazaki et al. | 228/110.1 |

FOREIGN PATENT DOCUMENTS 65833  3/1992  Japan.

OTHER PUBLICATIONS

Brochure: Hughes Model 2470-III Automatic Wedge Bonder 1991.
Operation Manual: Model 2470-111 Oct. 1991; pp. 3-3 to 3-15.
Brochure: Ultrasonic Bonding Tools For Ultrasonic Wire Bonding; Small Precision Tools; 8-1990-91, pp. 1-35.

*Primary Examiner*—Kenneth J. Ramsey
*Attorney, Agent, or Firm*—Elizabeth E. Leitereg; Terje Gudmestad; W. K. Denson-Low

[57] ABSTRACT

An apparatus for applying interconnect bumps to an integrated circuit comprising a wedge bonder assembly (10) including a bonding tool (14) adapted to be selectively moved relative to the integrated circuit (42) and to transmit ultrasonic force to bond wire or ribbon (62) located between the bonding tool (14) and the integrated circuit (42) to the integrated circuit and form an interconnect bump (63), the bonding tool (14) defining a passage (44) through which wire or ribbon (50) is passed to be brought into contact with the integrated circuit (42) and an edge (38) positioned and adapted to weaken wire or ribbon (50) as the bonding tool (14) is moved to the point at which the bonding tool (14) is closest to the integrated circuit (42), the wedge bonder assembly being adapted to move the bonding tool (14) so as to separate the interconnect bump (63) from the wire or ribbon (50) proximal of the bump.

1 Claim, 2 Drawing Sheets

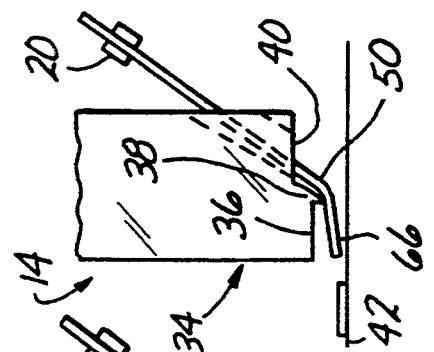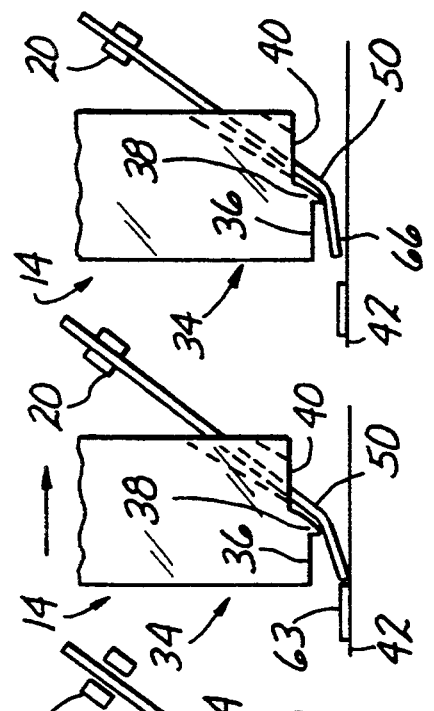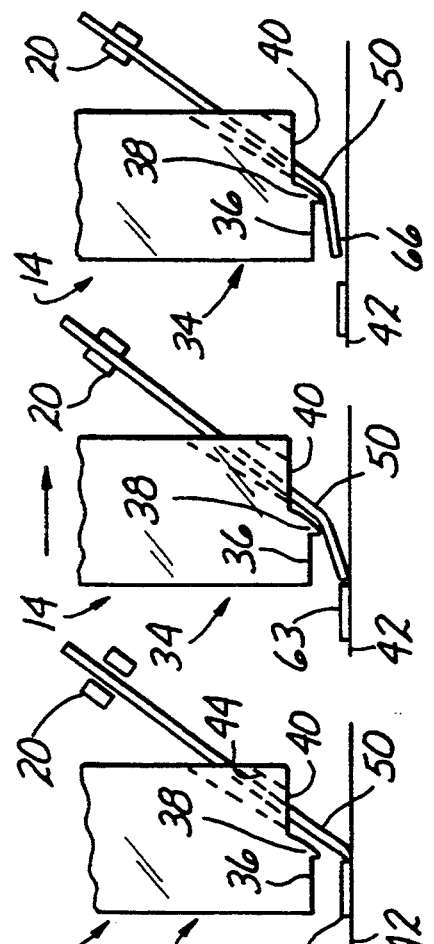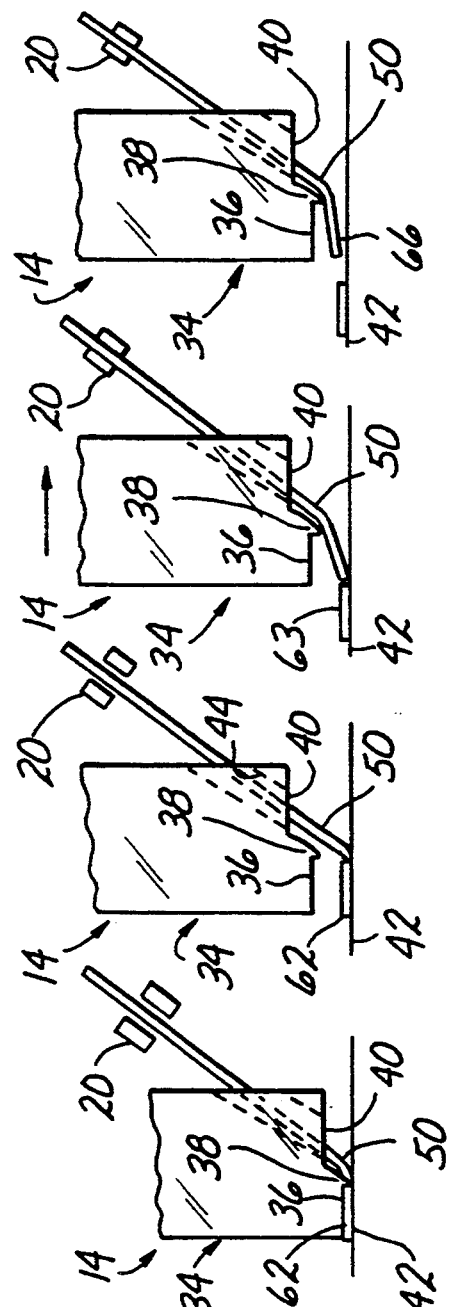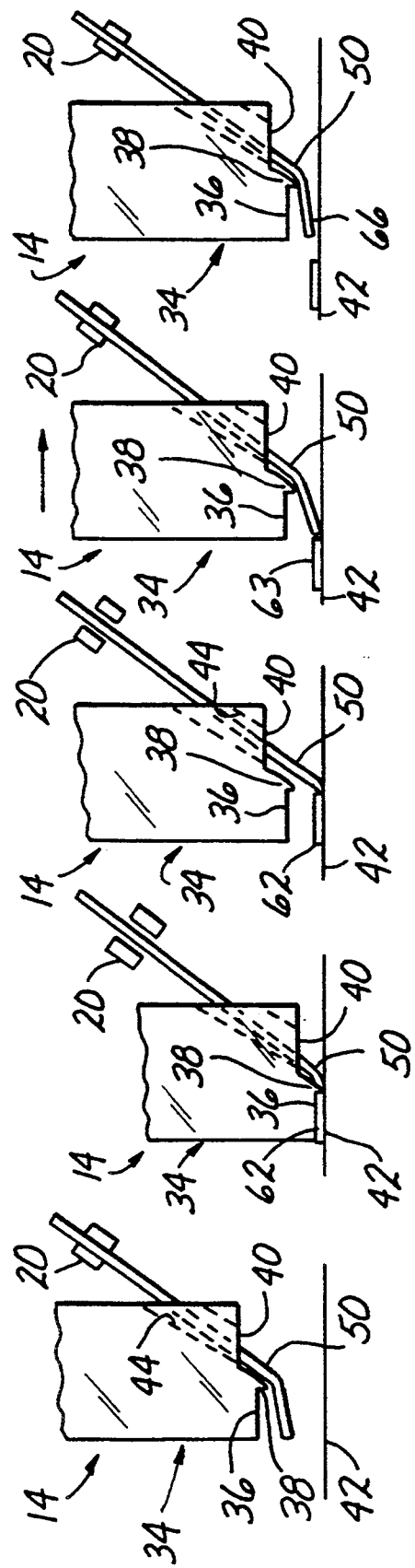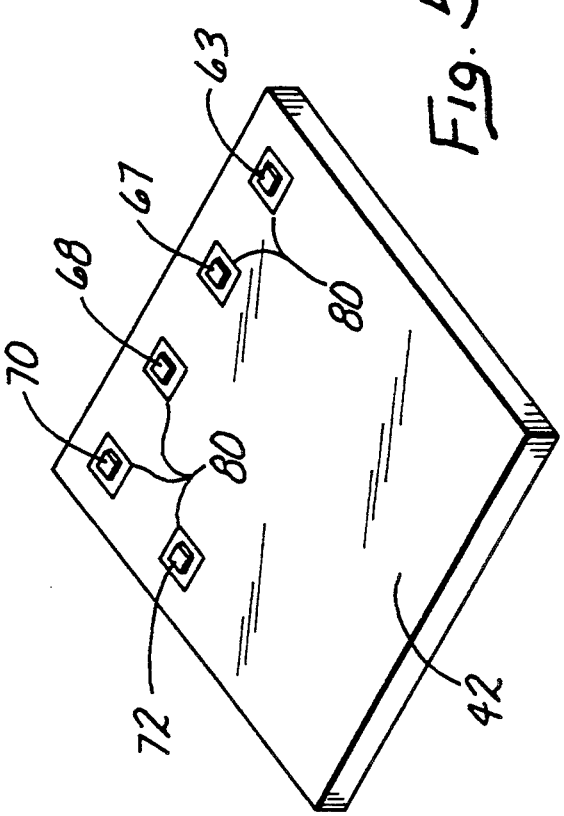

WEDGE BUMP BONDING APPARATUS AND METHOD

BACKGROUND OF THE INVENTION

1. Field of the Invention

This invention relates to apparatus and methods for applying interconnect bumps to an integrated circuit. More specifically, this invention relates to apparatus including a wedge bonder assembly with a new bonding tool and to methods employing such tool for applying interconnect bumps or pads to an integrated circuit or an integrated circuit die.

2. Description of Related Art

Semi-conductor or integrated circuit (IC) elements conventionally have raised input/output contact points, normally called interconnect bumps. Such bumps serve as terminals for attaching interconnect leads from the integrated circuits or integrated circuit dies to conductors on a substrate or circuit board. As used herein the term "integrated circuit" refers to both integrated circuits and integrated circuit dies.

Current methods of applying the bumps include relatively complicated electroplating methods for depositing the bump material, and conventional ball bonder methods for applying ball bumps. These methods often involve several steps. For example, such electroplating methods include photo etching of various materials to obtain a correct masking for the desired circuit design and one or more electroplating steps. These electroplating methods are relatively expensive to practice and can be accomplished only when adequate facilities and equipment are available. Ball bonder methods for applying bumps to integrated circuit chips include subjecting the initial ball bumps to planarization or tamping to provide the final ball bumps with flat top surfaces. This additional planarization or tamping operation limits speed, and increases cost. Further, the ball bumps may have varying diameters/sizes depending on the amount of material/wire remaining after being terminated and tamped into the bumps. Depending upon the application, variances in bump size may be unacceptable. In addition, the minimum size of the ball bumps is limited by the ball size. Thus, consistent ball bumps of less than about 3 mils (0.003 inches) in diameter are difficult to achieve.

Conventionally, wedge bonders are used to provide wire or ribbon connections between two points, for example, on the surface of an integrated circuit. Thus, the wedge bonder is used to make two discrete bonds with a wire or ribbon being attached or bonded to a first point and the wire ribbon being looped and then bonded to a spaced apart second point. Such wedge bonders have heretofore not been suggested for use in applying interconnect bumps to integrated circuits.

It would be advantageous to provide simplified and cost and time effective systems for applying interconnect bumps to integrated circuits.

SUMMARY OF THE INVENTION

This invention provides precise, simplified and rapid systems, that is apparatus and methods, of applying interconnect bumps to integrated circuits.

The systems of the invention involve the use of wedge bonder technology in combination with a new bonding tool to attach interconnect bumps to integrated circuits. The interconnect bumps, in accordance with the present invention, can be applied using conventional and well known wedge bonding equipment, in combination with a unique bonding tool. The bumps are applied in an automatic manner that is substantially faster, more precise and, thus, more cost effective than conventional bump application methods. The configuration of the bump is preferably square with the bump height, width and length determined by the bond energy applied and the size of the wire or ribbon.

The present invention provides a precise yet simplified method of applying interconnect bumps to microelectronic integrated circuit input/output terminals and is particularly applicable to low cost, high volume electronic component assemblies used in automotive, computer and consumer products industries. The advantages of the present invention include precise bump dimension control and bump application speed.

In one broad aspect, the present apparatus for applying interconnect bumps to an integrated circuit comprise a wedge bonder assembly including a bonding tool adapted to be selectively moved relative to an integrated circuit and to transmit ultrasonic force to bond wire or ribbon located between the bonding tool and the integrated circuit to the integrated circuit and form an interconnect bump. The bonding tool defines a passage through which wire or ribbon is passed to be brought into contact with the integrated circuit. An edge, positioned and adapted to weaken wire or ribbon as the bonding tool is moved to the point at which the bonding tool is closest to the integrated circuit, is provided. The wedge bonder assembly, which, except for the bonding tool, can be of conventional construction, is adapted to move the bonding tool so as to separate the newly applied interconnect bump from the wire or ribbon proximal of the bump. This separation or termination preferably occurs along the line or area of weakness in the wire or ribbon caused by the edge.

In another broad aspect, the invention provides bonding tools for use with wedge bonder assemblies for applying interconnect bumps to an integrated circuit. Such bonding tools comprise a tool body; a through passage having an outlet and defined by the tool body through which wire or ribbon is passed into proximity to an integrated circuit; an edge positioned and adapted to weaken wire or ribbon in contact with the edge and located between the edge and the integrated circuit; and a bonding face through which ultrasonic force is passed to bond wire or ribbon in contact with the bonding face and the integrated circuit.

In a further broad aspect, the invention provides methods for applying interconnect bumps to integrated circuits. These methods comprise: (a) passing a segment of a continuous wire or ribbon in proximity to an integrated circuit; (b) moving a bonding tool so as to more closely align the segment and the integrated circuit; (c) bonding the segment to the integrated circuit; and (d) separating the segment from the remainder of the continuous wire or ribbon. Such methods are very conveniently and effectively practiced using the present apparatus and/or bonding tools.

The invention, together with additional features and advantages thereof, may best be understood by reference to the following description taken in connection with the accompanying illustrative drawings.

BRIEF DESCRIPTION OF THE DRAWINGS

In the accompanying drawings:

FIGS. 2a–2e are schematic illustrations of certain steps of a method of applying intercurrent bumps to an integrated circuit in accordance with the present invention.

FIG. 5 is a perspective view showing an integrated circuit with a series or array of interconnect bumps applied thereto.

DESCRIPTION OF THE PREFERRED EMBODIMENT

Figure 1:
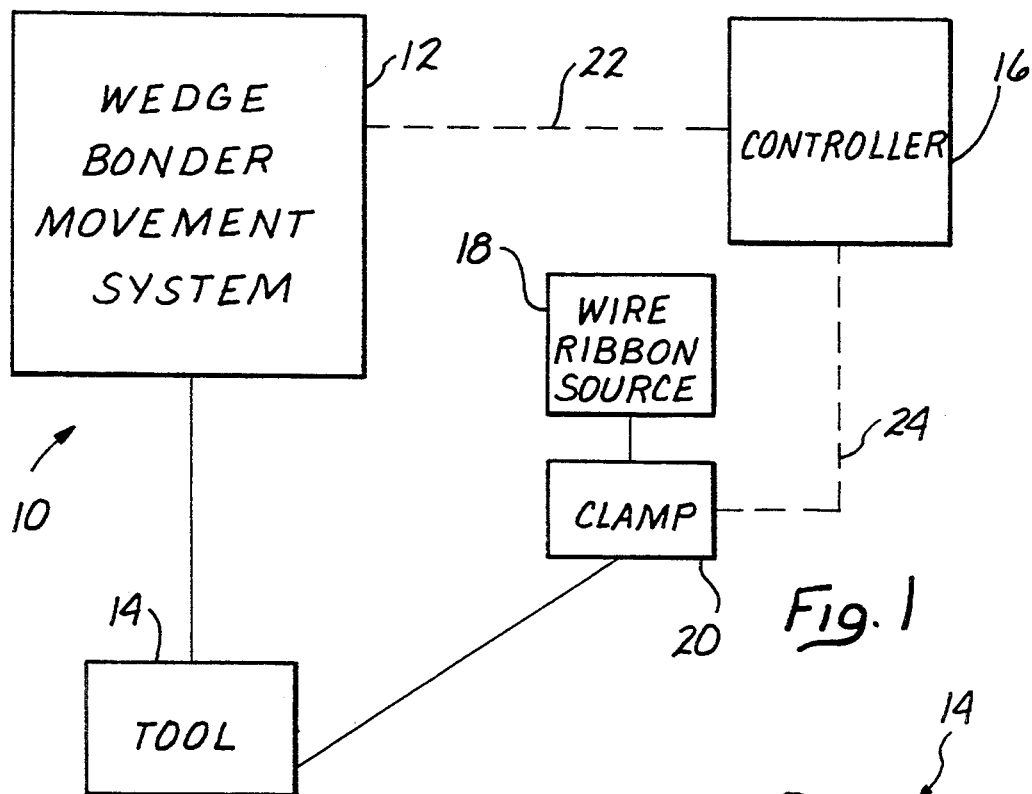
FIG. 1 is a schematic illustration of an embodiment of the apparatus of the present invention.

One embodiment of the apparatus in accordance with the present invention is shown schematically in FIG. 1. This apparatus, shown generally at 10, includes a wedge bonder movement system 12, a bonding tool 14, a computer-based controller 16, a wire or ribbon source (or spool) 18 and a wire or ribbon clamp 20. As shown by dashed signal lines 22 and 24, controller 16 controls the operation of system 12 and of clamp 20, respectively. Thus, controller 16 is preprogrammed with information so as to send instructions through signal line 22 to cause system 12 to move tool 14 in a controlled manner relative to the x, y and z axes, for example, of an integrated circuit. In addition, controller 16 is preprogrammed with other information so as to send instructions through signal line 24 to cause clamp 20 to open and close in a controlled manner.

Except for bonding tool 14, apparatus 10 can be, and preferably is, a conventional wedge bonder. An example of a useful wedge bonder is disclosed in Hill U.S. Pat. No. 4,718,591 which patent is incorporated herein in its entirety by reference. A particularly useful wedge bonder is the automatic wedge bonder sold by Hughes Aircraft Company under the trademark Hughes Model 2470-III. Since many of the components of apparatus 10 may be conventional and well known, a detailed description of the structure and operation of such components is not presented. However, as will be described hereinafter, controller 16 is preprogrammed so as to control the operation of apparatus 10 to apply interconnect bumps to integrated circuits, rather than, as a conventional wedge bonder is employed, to make wire connections between two spaced apart points.

Figure 3A:
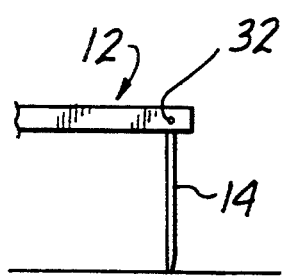
FIG. 3a is a partial side plan view showing the bonding tool of FIG. 3 connected to a wedge bonder assembly.
Figure 3:
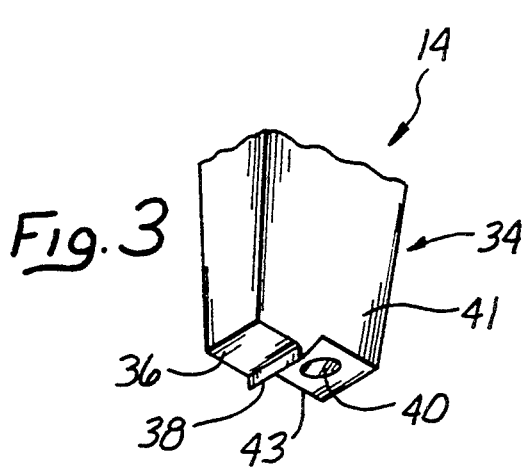
FIG. 3 is a partial perspective view of an embodiment of the bonding tool of the present invention.
Figure 4:
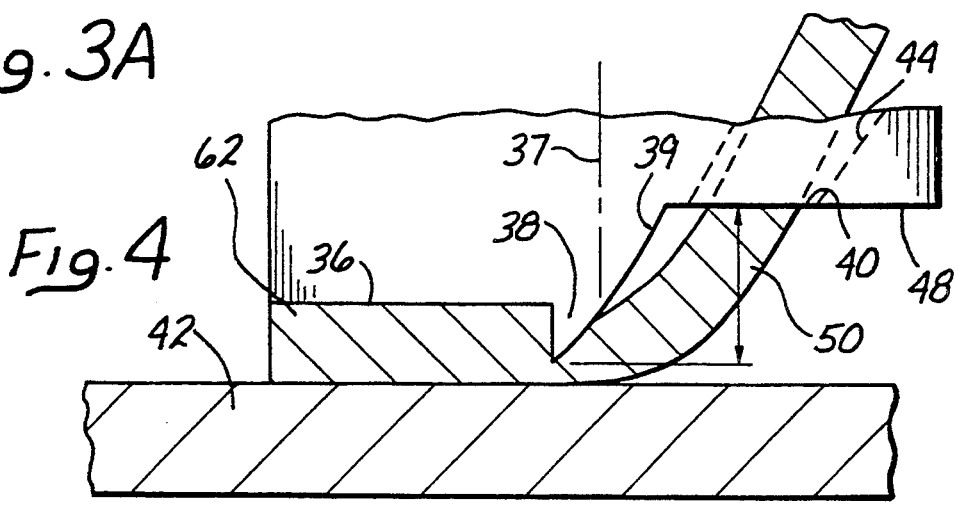
FIG. 4 is a partial view in cross-section showing the bonding tool of FIG. 3 at its closest point relative to an integrated circuit.

One important aspect of the present invention involves the configuration and functioning of bonding tool 14. As shown in FIG. 3A, bonding tool 14 is secured to system 12 by set screw 32. Referring to FIGS. 3 and 4, the distal end or tip 34 of bonding tool 14 includes a flat bonding face 36, an edge element 38 and a passage outlet 40 of passage 44 through which wire or ribbon 50 is pulled. Bonding face 36 is configured to come in contact with wire or ribbon segment 62 which is also in contact with integrated circuit 42 and to transmit ultrasonic force so as to bond this wire or ribbon segment to the integrated circuit to form an interconnect bump. The size and configuration of bonding face 36 is preferably substantially equal to the length and width, the dimensions in the x and y axes on integrated circuit 62, of the interconnect bump to be applied to the integrated circuit. Preferably, the plane defined by bonding face 36 is substantially perpendicular to the longitudinal axis 37 of bonding tool 14 and substantially parallel to the x-y plane defined by the integrated circuit 42 when the distal end 34 of the bonding tool is moved to the closest point to the integrated circuit. This feature is shown in FIG. 4.

Edge element 38 extends from the first side surface 41 of distal end 34 to the substantially opposing second side surface 43 of the distal end of bonding tool 14. Edge element 38 has sufficient sharpness so as to weaken, for example, to indent or crimp, the wire or ribbon located between the edge element and integrated circuit 42 as the distal end 34 of bonding tool 14 is moved to the closest point to the integrated circuit. The wire or ribbon 50 in contact with the edge element 38 is weakened substantially along the line or area of contact between the wire or ribbon and the edge element. However, it is important that edge element 38 be configured and be moved so as not to completely cut the wire or ribbon 50 or to come in direct contact with the integrated circuit 42. For example, if the edge element 38 completely cuts the wire or ribbon 50, apparatus 10 would not be usable to apply more than one interconnect bump since the wire or ribbon for the next interconnect bump would not be pulled through the passage 44. This would greatly reduce the time effectiveness or speed advantage of the present invention. Also, if the edge element 38 comes into direct contact with integrated circuit 42, substantial damage to the integrated circuit might result.

The bonding tool 14 further defines passage 44 which provides for passage of wire or ribbon 50 from wire or ribbon source or spool 18 toward the integrated circuit 42. As shown in FIG. 4, the surface 48 in which outlet 40 is located is situated more proximally than bonding face 36. This is advantageous because the ultrasonic force which bonds the segment of wire or ribbon in contact with bonding face 36 is not sufficiently strong to bond the wire or ribbon 50 directly under surface 48. In this manner, only the segment of wire or ribbon in contact with bonding face 36, such as segment 62, is bonded to the integrated circuit 42 to form the desired interconnect bump.

As shown in FIGS. 3 and 4, edge element 38 is located between bonding face 36 and outlet 40. This positioning is advantageous in allowing one interconnect bump to be applied to integrated circuit 42 while also allowing the remainder of continuous wire or ribbon 50 to be separated or torn from the newly applied bump and causing additional wire or ribbon to pass (be pulled) through outlet 40 in preparation for applying the next interconnect bump. Edge element 38 includes a somewhat convex curved surface 39 which is configured so as to facilitate wire or ribbon 50 from passage 44 to pass around the edge element and below bonding face 36 so that the repeated application of interconnect bumps to the integrated circuit 42 can be more easily and effectively accomplished using apparatus 10.

Wire or ribbon 50 may be made of any suitable conductive material, for example, metal, such as gold and the like. In a particularly useful embodiment, wire or ribbon 50 is selected from the wires and ribbons conventionally used with wedge bonders to form wire or ribbon connection between two spaced apart points.

Also, the wire or ribbon 50 may have any suitable configuration, for example, any suitable cross-section perpendicular to the longitudinal axis of the wire or ribbon and may be of any suitable size. Wire or ribbon 50 is preferably configured so that interconnect bumps derived therefrom in accordance with the present invention have a substantially flat top surface.

With reference to FIGS. 2a-2e, the operation of apparatus 10 is described as follows.

In FIG. 2a, continuous wire or ribbon 50 protrudes from outlet 40, around edge element 38 and under bonding face 36. Clamp 20 is closed at this point. With clamp 20 closed, wire or ribbon 50 is prevented from passing through passage 44 (from source 18). System 12, controlled by preprogrammed controller 16, automatically moves bonding tool 14 through the range of motions described herein. In addition, the opening and closing of clamp 20, as described herein, is controlled by preprogrammed controller 16. Clamp 20 includes a mechanism, for example, a standard solenoid, which can be activated to close the clamp.

As shown in FIG. 2b, the bonding tool 14 is moved downwardly toward the integrated circuit 42 so that the wire or ribbon segment 62 below bonding face 36 is brought into contact with both the bonding face and the integrated circuit. This is also shown, in more detail, in FIG. 4. At this point, with distal end 34 of bonding tool 14 being located at its closest point relative to integrated circuit 42, edge element 38 crimps wire or ribbon 50 so as to weaken the wire or ribbon. Ultrasonic force is passed through bonding face 36 to bond segment 62 to the integrated circuit 42. During this, clamp 20 is opened and remains open.

After wire or ribbon segment 62 has been bonded to integrated circuit 42, bonding tool 14 is raised from the integrated circuit. With the clamp 20 still open, an additional length of wire or ribbon 50 is allowed to pass through passage 44 and out of outlet 40. This is depicted in FIG. 2c. This additional length of wire or ribbon 50 ultimately becomes the next interconnect bump to be applied to the integrated circuit 42.

After this additional length of wire or ribbon 50 is pulled through outlet 40, the bonding tool 14, with clamp 20 now closed, is caused to move so as to separate or tear segment 62 from the additional length of wire or ribbon along the line or area of weakness caused by edge element 38. After this separation or tearing has occurred, segment 62 becomes interconnect bump 63 and bonding tool 14 is caused to move in a direction shown by the arrow in FIG. 2d. Clamp 20 remains closed during this movement. This movement of bonding tool 14 causes the additional length of wire or ribbon 50 to move around edge element 38 and under bonding face 36.

With reference to FIG. 2e, bonding tool 14 is moved to a position so that bonding face 34 is located directly above the area where the next interconnect bump is to be applied to integrated circuit 42. At this point, with clamp 20 closed, bonding tool 14 is moved downwardly toward the integrated circuit 42. The segment of wire or ribbon 66 between bonding face 36 and integrated circuit 42, by following the steps depicted in FIGS. 2b-2d, becomes ultrasonically bonded to the integrated circuit as interconnect bump 67 (shown in FIG. 5).

This cycle, depicted in FIGS. 2a-2e, is repeated for as many times as needed to apply the appropriate number of interconnect bumps to integrated circuit 42. With reference to FIG. 5, interconnect bumps 63, 67, 68, 70 and 72 are shown located on individual pads 80 of integrated circuit 42. This array of interconnect bumps can be made using apparatus 10, as described above. The bonding tool 14 can be rotated by system 12, for example, using well known wedge bonder technology, so as to provide the desired placement of the interconnect bumps on integrated circuit 42.

The present interconnect bumps can be of any suitable size, preferably in the range of about 1 mil to about 5 mils in length and width and about 0.3 mils to about 1 mil in thickness or depth. The present interconnect bumps can be of any suitable configuration. Bumps which are configured to have square top surfaces are particularly useful.

The interconnect bumps applied in accordance with the present invention are precisely sized and placed on integrated circuits. This size and placement is reproducible, because of the preciseness of the movement of the bonding tool of the present apparatus, such as apparatus 10 and because each attached interconnect bump is separated or torn from the remainder of the continuous wire or ribbon at a weakened area or line, as the result of the edge element on the bonding tool. The present bonding tool with an edge element, such as edge element 38, would be disadvantageous, or even totally ineffective, in use in a typical wedge bonder application. This is so because conventionally a wedge bonder is employed to connect a wire or ribbon between two spaced apart points. The edge element of the present bonding tool would make it Substantially more difficult, if not impossible, to connect a single segment of wire or ribbon to two spaced apart points. The edge element would tend to cause the wire or ribbon to break after the first bond in made.

The present invention provides simplified, very effective and relatively easy to use apparatus and methods for applying interconnect bumps to integrated circuits. Conventional wedge bonding technology can be employed in a new application so as to provide a cost and time effective approach to applying such interconnect bumps to integrated circuits. In addition, by providing a bonding tool and controlling its motion in accordance with the present invention, a wedge bonder system can be very effectively used for an entirely different application.

Although an exemplary embodiment has been shown and described, many changes, modifications and substitutions may be made by one having ordinary skill in the art without necessarily departing from the spirit and scope of this invention.

I claim:

1. A bonding tool for use with a wedge bonder assembly for applying interconnect bumps to an integrated circuit, which bonding tool comprises:

a tool body having a longitudinal axis and a distal end;

a bonding portion on said distal end having a flat bonding face perpendicular to said longitudinal axis;

a distal surface on said distal end perpendicular to said longitudinal axis, wherein said distal surface is parallel to and situated more proximally than said bonding face;

a through passage having an outlet in said distal surface and defined by said tool body through which wire or ribbon is passed into proximity to the integrated circuit; and an edge element positioned between said bonding face and said outlet in said distal surface that terminates more distally than said bonding face, said edge element having a surface adjacent to and perpendicular to said bonding face and a convex surface adjacent to and extending proximally to said distal surface, wherein said edge element is adapted to weaken wire or ribbon located between said edge element and the integrated circuit that is in contact with said edge element and said convex surface is configured to facilitate the passage of wire or ribbon around said edge element below said bonding face; and wherein said bonding face is parallel to the integrated circuit and passes ultrasonic force is passed to bond wire or ribbon in contact with said bonding face and the integrated circuit.

* * * * *